United States Patent
Wen

(10) Patent No.: US 10,624,164 B2
(45) Date of Patent: Apr. 14, 2020

(54) ELECTRONIC BALLAST-BASED DEVICE FOR CONTROLLING ELECTRONIC CONTROL CIRCUIT AND LIGHTING LAMP

(71) Applicant: OPPLE LIGHTING CO., LTD., Shanghai (CN)

(72) Inventor: Wei Wen, Shanghai (CN)

(73) Assignee: Opple Lighting Co., Ltd., Shanghai (CN)

( * ) Notice: Subject to any disclaimer, the term of this patent is extended or adjusted under 35 U.S.C. 154(b) by 0 days.

(21) Appl. No.: 16/266,010

(22) Filed: Feb. 2, 2019

(65) Prior Publication Data

US 2019/0174590 A1 Jun. 6, 2019

Related U.S. Application Data

(63) Continuation of application No. PCT/CN2017/095671, filed on Aug. 2, 2017.

(30) Foreign Application Priority Data

Aug. 2, 2016 (CN) .......................... 2016 1 0626560
Aug. 2, 2016 (CN) ...................... 2016 2 0831198 U

(51) Int. Cl.
*H05B 33/08* (2020.01)
*H05B 37/02* (2006.01)
(Continued)

(52) U.S. Cl.
CPC ......... *H05B 33/0815* (2013.01); *G01R 23/02* (2013.01); *H05B 33/0851* (2013.01); *H05B 37/02* (2013.01); *H05B 41/38* (2013.01)

(58) Field of Classification Search
CPC ............ H05B 33/0842; H05B 33/0845; H05B 33/0815; H05B 33/0827; H05B 33/0809;
(Continued)

(56) References Cited

U.S. PATENT DOCUMENTS 7,456,588 B2* 11/2008 Alexandrov ....... H05B 37/0263
315/288
8,482,214 B2* 7/2013 Hui .................... H05B 33/0809
315/201
(Continued)

FOREIGN PATENT DOCUMENTS

CN 205124089 U 3/2016
CN 105612814 A 5/2016
(Continued)

OTHER PUBLICATIONS

International Search Report (including English translation) and Written Opinion issued in PCT/CN2017/095671, dated Oct. 31, 2017, 9 pages.

*Primary Examiner* — Haissa Philogene
(74) *Attorney, Agent, or Firm* — Arch & Lake LLP

(57) ABSTRACT

The present disclosure provides an electronic ballast-based device for controlling an electronic control circuit and a lighting lamp. The device includes an electronic ballast and an electronic control circuit which are connected with each other, the electronic control circuit including a filament analog circuit, a rectifier bridge circuit, at least two frequency detection circuits connected in parallel, an interface logic circuit and a switching circuit; the electronic ballast is connected with the switch circuit sequentially through the filament analog circuit and the rectifier bridge circuit; the at least two frequency detection circuits connected in parallel have one end connected between the filament analog circuit and the rectifier bridge circuit, or connected between the electronic ballast and the filament analog circuit, and another end connected with the interface logic circuit; and the interface logic circuit is connected with the switching circuit.

17 Claims, 4 Drawing Sheets

(51) Int. Cl.
*G01R 23/02* (2006.01)
*H05B 41/38* (2006.01)

(58) Field of Classification Search
CPC ............ H05B 33/0851; H05B 33/0806; H05B 33/0824; H05B 33/0884; H05B 33/0887; H05B 37/02; H05B 41/38; Y02B 20/346; Y02B 20/48; F21Y 2115/10; G01R 23/02
See application file for complete search history.

(56) References Cited

U.S. PATENT DOCUMENTS

| | | | |
|---|---|---|---|
| 9,441,795 B2 | 9/2016 | Segers | |
| 9,807,826 B2 * | 10/2017 | Xiong | H05B 33/0809 |
| 9,860,959 B2 * | 1/2018 | Xiong | F21V 3/061 |
| 2015/0198290 A1 | 7/2015 | Segers | |
| 2016/0345402 A1 | 11/2016 | Seegers | |
| 2019/0174596 A1 * | 6/2019 | Wen | H05B 33/0893 |

FOREIGN PATENT DOCUMENTS

| | | |
|---|---|---|
| CN | 106102290 A | 11/2016 |
| CN | 205987508 U | 2/2017 |
| WO | 2012068687 A1 | 5/2012 |

* cited by examiner

ELECTRONIC BALLAST-BASED DEVICE FOR CONTROLLING ELECTRONIC CONTROL CIRCUIT AND LIGHTING LAMP

CROSS-REFERENCE TO RELATED APPLICATIONS

This application is based upon and claims the priority of PCT patent application No. PCT/CN2017/095671 filed on Aug. 2, 2017 which claims the priority of Chinese Patent Application No. 201610626560.7 filed on Aug. 2, 2016 and Chinese Patent Application No. 201620831198.2 filed on Aug. 2, 2016, the entire content of all of which is hereby incorporated by reference herein for all purposes.

TECHNICAL FIELD

The present disclosure relates to a lighting field, and more particularly, to an electronic ballast-based device for controlling an electronic control circuit and a lighting lamp.

BACKGROUND

With improvement of LED light efficiency, the use of an LED light source instead of a fluorescent lamp has become a development trend. The fluorescent lamp generally requires an inductive ballast or an electronic ballast for power supply; the inductive ballast outputs a power-frequency signal, for example, a voltage and current signal at 50/60 Hz, and the electronic ballast outputs a high-frequency signal, which is generally greater than 20 kHz. In alternative applications, an LED driver also needs to be compatible with the inductive ballast or the electronic ballast, and even needs to be compatible with both the inductive ballast and the electronic ballast.

SUMMARY

The present disclosure provides an electronic ballast-based device for controlling an electronic control circuit, a lighting lamp and a method of manufacturing an electronic ballast-based device.

According to one aspect of the present disclosure, an electronic ballast-based device for controlling an electronic control circuit is provided. The electronic ballast-based device may include an electronic ballast and an electronic control circuit which are connected with each other, where the electronic control circuit includes a filament analog circuit, a rectifier bridge circuit, at least two frequency detection circuits connected in parallel, an interface logic circuit, and a switching circuit.

The electronic ballast may be connected with the switching circuit sequentially through the filament analog circuit and the rectifier bridge circuit; the at least two frequency detection circuits connected in parallel may have one end connected between the filament analog circuit and the rectifier bridge circuit, or connected between the electronic ballast and the filament analog circuit, and another end connected with the interface logic circuit; the interface logic circuit may be connected with the switching circuit, and the interface logic circuit may be configured to control working logic between the at least two frequency detection circuits connected in parallel.

According to another aspect of the present disclosure, a lighting lamp may be provided. The lighting lamp may include the electronic ballast-based device for controlling an electronic control circuit and the electronic ballast-based device may include an electronic ballast and an electronic control circuit which are connected with each other, where the electronic control circuit may include a filament analog circuit, a rectifier bridge circuit, at least two frequency detection circuits connected in parallel, an interface logic circuit, and a switching circuit.

The electronic ballast may be connected with the switching circuit sequentially through the filament analog circuit and the rectifier bridge circuit; the at least two frequency detection circuits connected in parallel may have one end connected between the filament analog circuit and the rectifier bridge circuit, or connected between the electronic ballast and the filament analog circuit, and another end connected with the interface logic circuit; the interface logic circuit may be connected with the switching circuit, and the interface logic circuit may be configured to control working logic between the at least two frequency detection circuits connected in parallel.

The lighting lamp may also include a light emitting device that may be connected with the electronic control circuit in the electronic ballast-based device for controlling the electronic control circuit, and may be configured to be turned on or off under control of the electronic control circuit.

According to a third aspect of the present disclosure, a method of manufacturing an electronic ballast-based device for controlling an electronic control circuit is provided. The method may include providing an electronic ballast and an electronic control circuit which are connected with each other, where the electronic control circuit may include a filament analog circuit, a rectifier bridge circuit, at least two frequency detection circuits connected in parallel, an interface logic circuit, and a switching circuit.

The method may also include connecting the electronic ballast with the switching circuit sequentially through the filament analog circuit and the rectifier bridge circuit; connecting the at least two frequency detection circuits in parallel, where the at least two frequency detection circuits have one end connected between the filament analog circuit and the rectifier bridge circuit, or connected between the electronic ballast and the filament analog circuit, and another end connected with the interface logic circuit; and connecting the interface logic circuit with the switching circuit, and connecting the interface logic circuit to control working logic between the at least two frequency detection circuits connected in parallel.

It is to be understood that both the foregoing general description and the following detailed description are exemplary and explanatory only and are not restrictive of the present disclosure.

BRIEF DESCRIPTION OF THE DRAWINGS

The drawings illustrated here are provided for further understanding the examples of the present disclosure and constitute a part of the present disclosure, and are used for explaining the present disclosure together with the examples of the present disclosure and description thereof, rather than improperly limiting the present disclosure. In the drawings.

DETAILED DESCRIPTION

In order to make those skilled in the art to better understand the technical solutions in the present disclosure, the technical solutions of the examples will be described in a clearly and fully understandable way in connection with the drawings related to the examples of the present disclosure. Apparently, the described examples are just a part but not all of the examples of the present disclosure. Based on the described examples herein, those skilled in the art can obtain other example(s), without any inventive work, which should be within the scope of the present disclosure.

The terminology used in the present disclosure is for the purpose of describing exemplary examples only and is not intended to limit the present disclosure. As used in the present disclosure and the appended claims, the singular forms "a," "an" and "the" are intended to include the plural forms as well, unless the context clearly indicates otherwise. It shall also be understood that the terms "or" and "and/or" used herein are intended to signify and include any or all possible combinations of one or more of the associated listed items, unless the context clearly indicates otherwise.

It shall be understood that, although the terms "first," "second," "third," and the like may be used herein to describe various information, the information should not be limited by these terms. These terms are only used to distinguish one category of information from another. For example, without departing from the scope of the present disclosure, first information may be termed as second information; and similarly, second information may also be termed as first information. As used herein, the term "if" may be understood to mean "when" or "upon" or "in response to" depending on the context.

Figure 1:
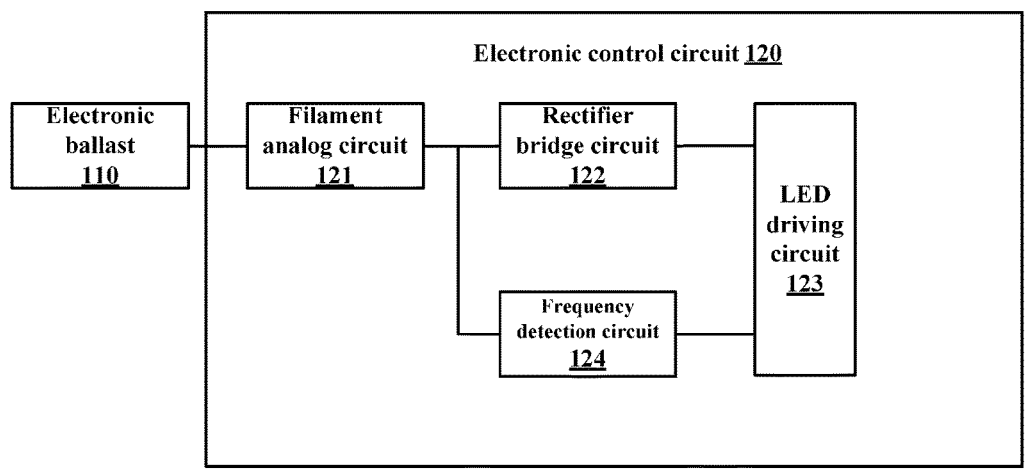
FIG. 1 is a schematic block diagram of an electronic ballast-based device for controlling an electronic control circuit.

In an application compatible with the electronic ballast or compatible with both the inductive ballast and the electronic ballast, an LED-driven switch tube applied to an electronic control circuit of a lighting lamp is usually driven by a frequency detection circuit, as illustrated in FIG. 1. In FIG. 1, a mains alternating current power supply is input to an electronic ballast 110, and is inverted by the electronic ballast 110 to output high-frequency voltage and current, which generally have a working frequency greater than 20 kHz, and the high-frequency voltage and current are input to an electronic control circuit 120. Inside the electronic control circuit 120, the high-frequency alternating-current voltage and current pass through a filament analog circuit 121 to enter into a rectifier bridge circuit 122, and then pass through an LED driving circuit 123 to output an appropriate current. The LED driving circuit 123 at least includes a switch tube S, for example, a power triode, a field-effect transistor, an IGBT or other electronic switches.

Figure 2:
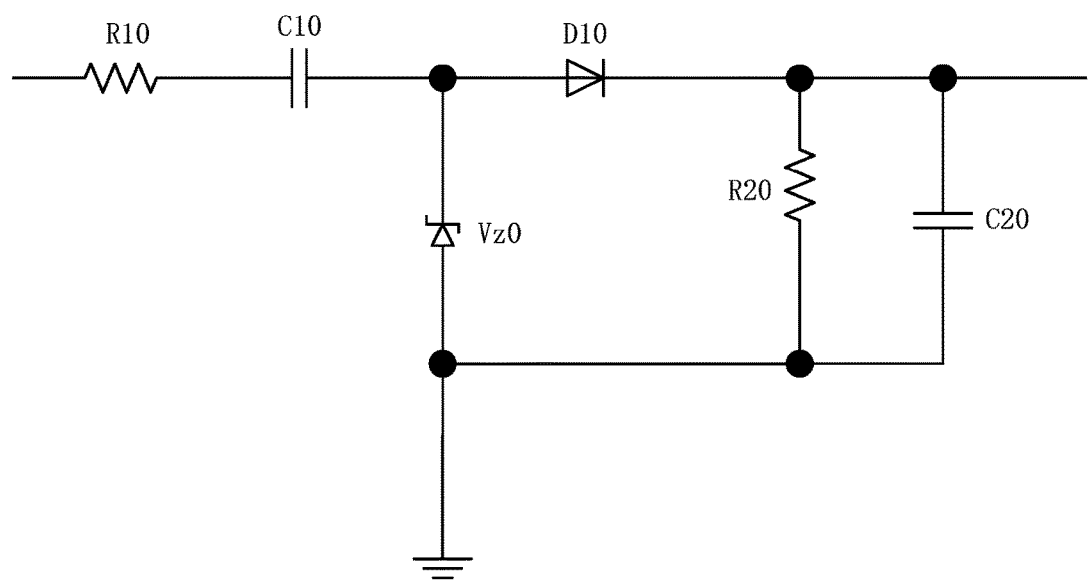
FIG. 2 is a schematic circuit diagram of a frequency detection circuit in the electronic ballast-based device for controlling an electronic control circuit of FIG. 1.

A driving signal of the switch tube S is from a frequency detection circuit 124, and an input of the frequency detection circuit 124 is from a circuit between the filament analog circuit 121 and the rectifier bridge circuit 122, while an output of the frequency detection circuit 124 serves for driving the switch tube S. The frequency detection circuit 124 is usually designed such that: in the case that an input frequency is a low frequency mains power supply and the lamp tube is connected with an inductive ballast, the output of the frequency detection circuit 124 is at low level, which cannot drive the switch tube S; in the case that the input frequency is a high frequency and the lamp tube is connected with an electronic ballast, the output of the frequency detection circuit 124 is at high level, and the switch tube S is turned on. A circuit diagram of the frequency detection circuit 124 of FIG. 1 is as illustrated in FIG. 2. In FIG. 2, a voltage before the rectifier bridge circuit 122 (with reference to FIG. 1) passes through a resistor R10 and a capacitor C10, which is connected with a diode D10 on the one hand, and connected with a voltage-regulator tube Vz0 on the other hand. An output of the diode D10 passes through a resistor R20 and a capacitor C20 and then is grounded, and the R20 and the C20 have a voltage thereon as an output for controlling an action of a power switch. Since the voltage before the rectifier bridge circuit 122 is an alternating-current voltage, the alternating-current voltage passes through the capacitor C10 to generate a certain current, whose magnitude is related to a capacitance value of the C10, an amplitude of the alternating-current voltage, and a frequency of the alternating-current voltage.

In the case that the alternating-current voltage is a power-frequency signal, a current flowing through the C10 is relatively small because the low-frequency condensance of the C10 is very large, thus the current passes through the D10 to generate a relatively low voltage on the R20 and the C20, which cannot drive the switch tube S. In the case that the alternating-current voltage is a high-frequency signal, the condensance of C10 is relatively small, so the current flowing through the C10 becomes larger correspondingly, and generates a high level on the R20 and the C20, to drive the switch tube to be turned on.

It may be known from FIG. 1 and FIG. 2 that, although the above circuit can drive the switch tube S to be turned on while an input is provided for the electronic ballast, some brands of ballasts will intermittently output high-frequency signals while the ballasts are turned off. These high-frequency signals pass through the frequency detection circuit to cause the switch tube S to be intermittently turned on, so that the LED light source in the above-described lighting lamp emits light intermittently. If working with such a ballast, the lighting lamp having the electronic control circuit will have a blinking phenomenon occurring to the LED light source after the lighting lamp is powered off, causing dissatisfaction from a user. Although the problem may be resolved by adding delay to an output of the frequency detection circuit, yet a delay circuit introduces another problem that, a ballast of a non-preheating type connected therewith cannot drive the switch tube S to be turned on in time due to the delay circuit, causing the ballast to output overvoltage, and increasing risk of failure of the LED light source.

Figure 3A:
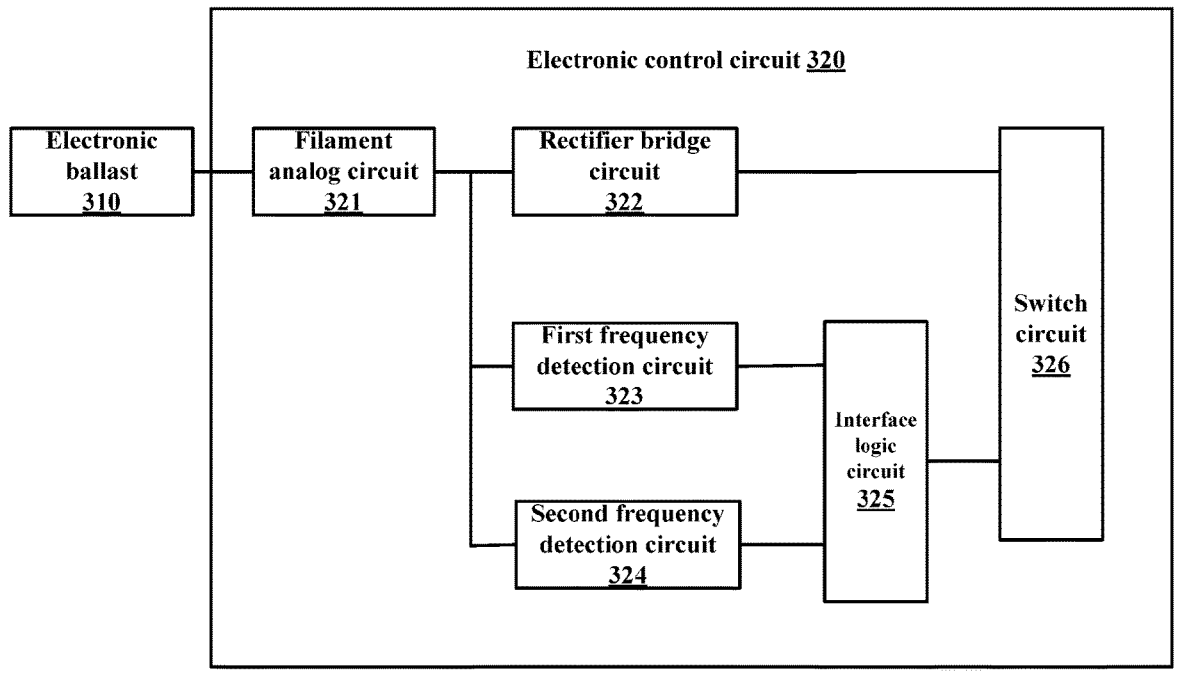
FIG. 3a is a schematic block diagram of an electronic ballast-based device for controlling an electronic control circuit according to an example of the present disclosure.
Figure 3B:
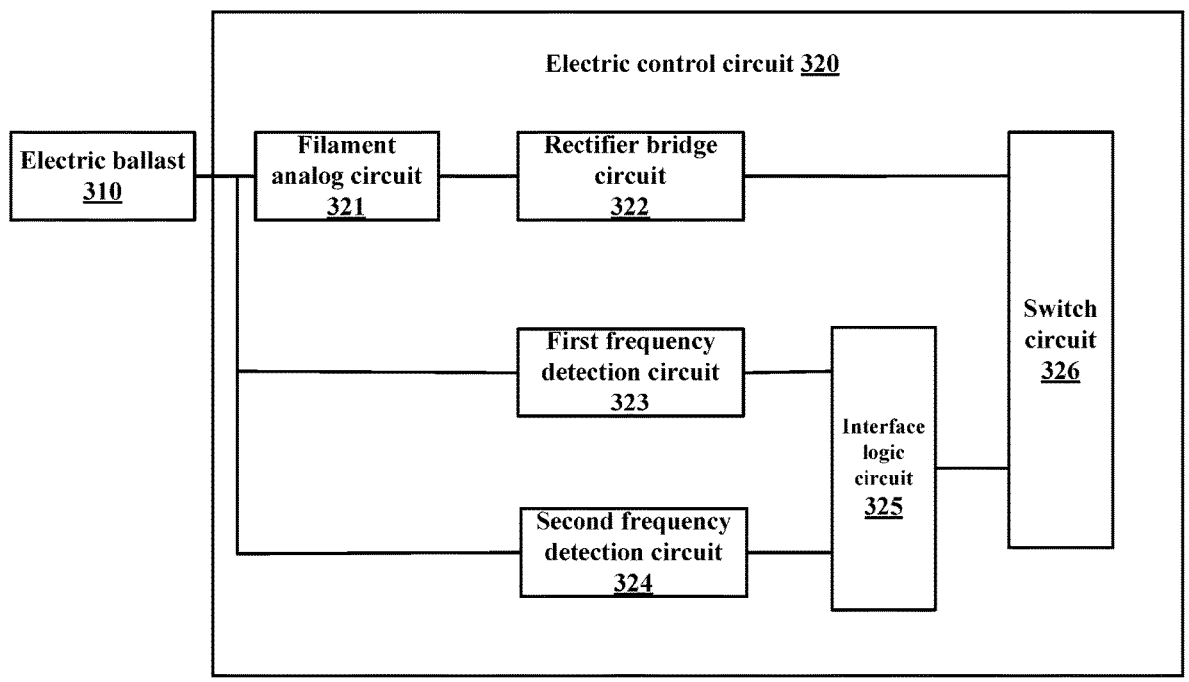
FIG. 3b is a schematic block diagram of an electronic ballast-based device for controlling an electronic control circuit according to another example of the present disclosure.

FIG. 3a and FIG. 3b are schematic block diagrams of an electronic ballast-based device for controlling an electronic control circuit according to an example of the present disclosure. As illustrated in FIG. 3a and FIG. 3b, the device may typically comprise an electronic ballast 310 and an electronic control circuit 320 which are connected with each other, wherein the electronic control circuit 320 includes a filament analog circuit 321, a rectifier bridge circuit 322, at least two frequency detection circuits connected in parallel (two frequency detection circuits connected in parallel are schematically illustrated in FIG. 3a and FIG. 3b, including a first frequency detection circuit 323 and a second frequency detection circuit 324), an interface logic circuit 325, and a switching circuit 326. In FIG. 3a and FIG. 3b, the electronic ballast 310 is connected with the switching circuit 326 sequentially through the filament analog circuit 321 and the rectifier bridge circuit 322; the at least two frequency detection circuits connected in parallel (including the first frequency detection circuit 323 and the second frequency detection circuit 324) have one end connected between the filament analog circuit 321 and the rectifier bridge circuit 322 (as illustrated in FIG. 3a), or connected between the electronic ballast 310 and the filament analog circuit 321 (as illustrated in FIG. 3b), and the other end connected with the interface logic circuit 325; the interface logic circuit 325 is connected with the switching circuit 326, and the interface logic circuit 325 is configured to control working logic between the at least two frequency detection circuits connected in parallel.

In this example, the first frequency detection circuit 323 is configured to be activated when a low-frequency signal is input, while the second frequency detection circuit 324 is configured to be activated when a high-frequency signal is input. The high-frequency impedance of the first frequency detection circuit 323 is less than high-frequency impedance of the second frequency detection circuit 324. In this example, since the first frequency detection circuit 323 is configured to be activated when the low-frequency signal is input, and meanwhile, the second frequency detection circuit 324 is configured to be activated when the high-frequency signal is input, the first frequency detection circuit 323 can provide a stable working signal to the switching circuit 326 in the electronic control circuit 320, and meanwhile, the second frequency detection circuit 324 can provide an activating signal to the switching circuit 326.

Because the second frequency detection circuit 324 provides the activating signal for the switching circuit 326 and its high-frequency impedance is relatively large, an intermittent high-frequency signal output by the electronic ballast 310 cannot activate the switching circuit 326 while the electronic ballast 310 is turned off. While the electronic ballast 310 is turned on normally, it outputs a voltage of a higher frequency or a larger amplitude, which causes the second frequency detection circuit 324 to activate the switching circuit 326; while the electronic ballast 310 works stably, the first frequency detection circuit 323 with smaller high-frequency impedance provides a working voltage of the switching circuit 326, so that the switching circuit 326 can maintain stable working.

In one example, in the above-described electronic control circuit 320, the first frequency detection circuit 323 includes a first capacitor, the first capacitor has one end connected with an input end of the first frequency detection circuit 323, and the other end connected with the interface logic circuit 325; specifically, in the case that the device illustrated in FIG. 3a is used, the first capacitor has one end connected between the filament analog circuit 321 and the rectifier bridge circuit 322, and the other end connected with the interface logic circuit 325. In the case that the device illustrated in FIG. 3b is used, the first capacitor has one end connected between the electronic ballast 310 and the filament analog circuit 321, and the other end connected with the interface logic circuit 325; the second frequency detection circuit 324 includes a second capacitor, the second capacitor has one end connected with the input end of the second frequency detection circuit 324, and the other end connected with the interface logic circuit 325; specifically, in the case that the device illustrated in FIG. 3a is used, the second capacitor has one end connected between the filament analog circuit 321 and the rectifier bridge circuit 322, and the other end connected with the interface logic circuit 325; in the case that the device illustrated in FIG. 3b is used, the second capacitor has one end connected between the electronic ballast 310 and the filament analog circuit 321, and the other end connected with the interface logic circuit 325. Wherein, a capacitance value of the first capacitor is greater than a capacitance value of the second capacitor. In this example, the capacitance value of the first capacitor is greater than the capacitance value of the second capacitor, because: if the capacitance value of the first capacitor is greater than the capacitance value of the second capacitor, high-frequency condensance of the first capacitor is less than high-frequency condensance of the second capacitor; in the case that a same alternating-current signal is input, a current flowing through the first capacitor is greater than a current flowing through the second capacitor, so as to further achieve an objective that the first frequency detection circuit 323 is activated when the low-frequency signal is input, and the second frequency detection circuit 324 is activated when the high-frequency signal is input.

In one example, the first frequency detection circuit 323 further includes a first diode and a first voltage-regulator component, the first diode is connected between the first capacitor and the interface logic circuit 325, and the first voltage-regulator component is connected in parallel with both ends of the first diode; the second frequency detection circuit 324 further includes a second diode and a second voltage-regulator component, the second diode is connected between the second capacitor and the interface logic circuit 325, and the second voltage-regulator component is connected in parallel with both ends of the second diode. In this example, the first voltage-regulator component and the second voltage-regulator component are respectively composed of a resistor and a capacitor connected in parallel.

In one example, the first frequency detection circuit 323 further includes a first voltage-regulator tube, the first voltage-regulator tube is connected with the first voltage-regulator component, or the first voltage-regulator tube has a negative electrode connected between the first capacitor and the first diode, and a positive electrode connected with one end of the first voltage-regulator component and grounded; the second frequency detection circuit 324 further includes a second voltage-regulator tube, the second voltage-regulator tube is connected with the second voltage-regulator component, or, the second voltage-regulator tube has a negative electrode connected between the second capacitor and the second diode, and a positive electrode connected with one end of the second voltage-regulator component and grounded.

In one example, the first frequency detection circuit 323 further includes a first resistor for current limiting, the first resistor is connected between the input end of the first frequency detection circuit 323 and the first capacitor; the second frequency detection circuit 324 further includes a second resistor for current limiting, and the second resistor is connected between the input end of the second frequency detection circuit 324 and the second capacitor.

In one example, the interface logic circuit 325 includes a first controllable switch, the first controllable switch is connected between the first frequency detection circuit 323 and the switching circuit 326, and the first controllable switch controls working logic between the first frequency detection circuit 323 and the second frequency detection circuit 324 through its own ON-OFF state. Wherein, the first controllable switch may be a triode switch or a field-effect transistor switch, and of course, may also be any other controllable electronic switch, which will not be limited in this example.

In one example, in the case that the first controllable switch is a first triode switch, the interface logic circuit 325 further includes a second triode switch and a feedback resistor, wherein, an emitter of the first triode switch is connected with the first frequency detection circuit 323, a collector of the first triode switch is connected with the switching circuit 326, a base of the first triode switch is grounded through the second triode switch; the feedback resistor has one end connected between the first triode switch and the switching circuit 326, and the other end connected with the second triode switch; and an emitter of the second triode switch is grounded.

In one example, the first triode switch is a PNP-type triode switch, and the second triode switch is an NPN-type triode switch.

In one example, the interface logic circuit 325 further includes a third resistor for reducing input impedance and a fourth resistor for current limiting, the third resistor is connected in parallel with both ends of the emitter and the base of the first triode switch, and the fourth resistor is connected between the base of the first triode switch and a collector of the second triode switch.

The interface logic circuit 325 according to the above-described examples may be implemented through various circuit structures, and two different circuit structures are described in detail below through two specific examples.

Figure 4:
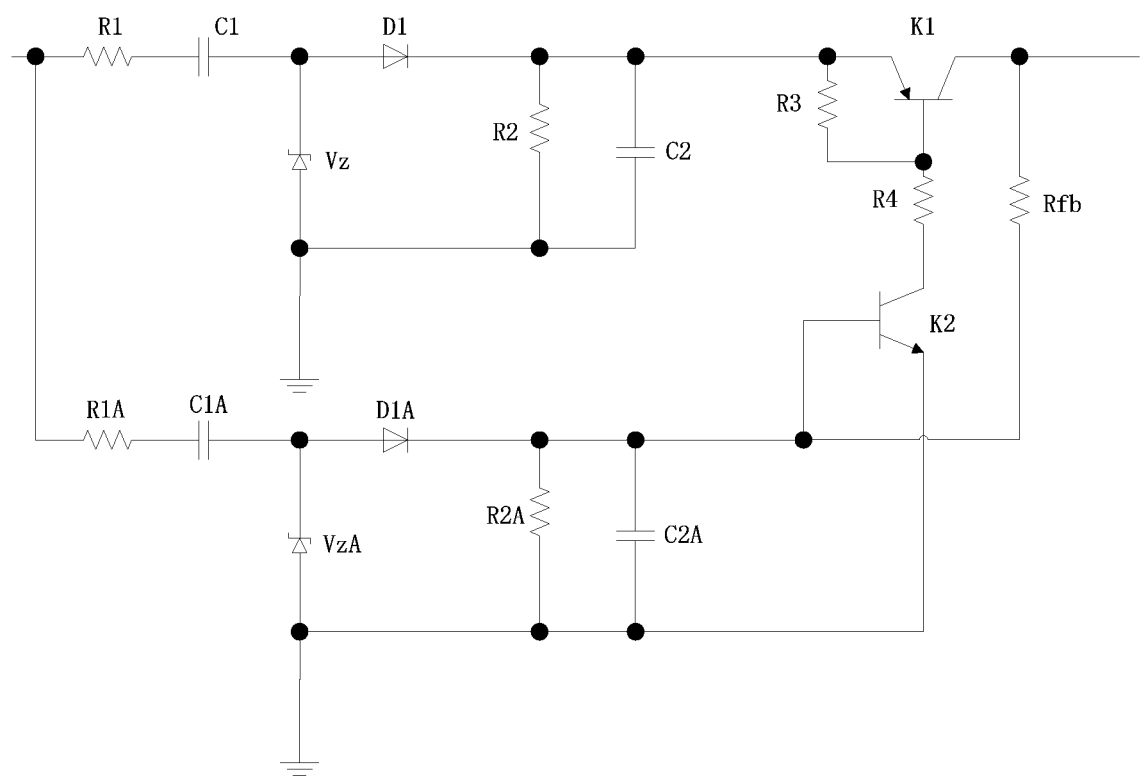
FIG. 4 is a schematic diagram illustrating a circuit structure of an electronic control circuit according to an example of the present disclosure.

FIG. 4 is a partial circuit schematic diagram of an electronic control circuit 320 (with reference to FIG. 3a and FIG. 3b) according to an example. As illustrated in FIG. 4, a first resistor R1, a first capacitor C1, a first diode D1, a first voltage-regulator component and a first voltage-regulator tube Vz constitute a first frequency detection circuit 323 (with reference to FIG. 3a and FIG. 3b), wherein, the first voltage-regulator component is composed of a resistor R2 and a capacitor C2 connected in parallel, the first resistor R1, the first capacitor C1, the first diode D1 and the first voltage-regulator component are sequentially connected in series with an interface logic circuit 325 (with reference to FIG. 3a and FIG. 3b), a negative electrode of the first voltage-regulator tube Vz is connected between the first capacitor C1 and the first diode D1, and a positive electrode of the first voltage-regulator tube Vz is connected with the first voltage-regulator component and grounded; a second resistor R1A, a second capacitor C1A, a second diode D1A, a second voltage-regulator component and a second voltage-regulator tube VzA constitute a second frequency detection circuit 324 (with reference to FIG. 3a and FIG. 3b), wherein, the second voltage-regulator component is composed of a resistor R2A and a capacitor C2A connected in parallel, the second resistor R1A, the second capacitor C1A, the second diode D1A and the second voltage-regulator component are sequentially connected in series with the interface logic circuit 325, a negative electrode of the second voltage-regulator tube VzA is connected between the second capacitor C1A and the second diode D1A, and a positive electrode of the second voltage-regulator tube VzA is connected with the second voltage-regulator component and grounded; wherein, a capacitance value of the first capacitor C1 is greater than a capacitance value of the second capacitor C1A. A PNP-type triode switch K1, an NPN-type triode switch K2, a third resistor R3, a fourth resistor R4 and a feedback resistor Rbf constitute the interface logic circuit 325, wherein, an emitter of the switch K1 is connected with the first frequency detection circuit 323, a collector of the switch K1 is connected with a switching circuit 326 (with reference to FIG. 3a and FIG. 3b), a base of the switch K1 is grounded sequentially through the fourth resistor R4 and the switch K2, the third resistor R3 is connected in parallel with both ends of the switch K1, the feedback resistor Rbf has one end connected between the switch K1 and the switching circuit 326, and the other end connected with a base of the switch K2, the base and an emitter of the switch K2 are respectively connected with both ends of the second voltage-regulator component in the second frequency detection circuit 324, and the emitter of the switch K2 is grounded through the second voltage-regulator component.

In the circuit illustrated in FIG. 4, the capacitance value of the first capacitor C1 is greater than the capacitance value of the second capacitor C1A, so high-frequency condensance of the first capacitor C1 is less than high-frequency condensance of the second capacitor C1A, and with respect to a same alternating-current signal input, a current flowing through the first capacitor C1 is greater than a current flowing through the second capacitor C1A. While working normally, the electronic ballast 310 outputs a high-frequency voltage, the high-frequency voltage passes through the first capacitor C1 and the second capacitor C1A, to respectively generate voltages on the resistor R2 and the capacitor C2 of the first voltage-regulator component, and generate voltages on the resistor R2A and the capacitor C2A of the second voltage-regulator component; an amplitude or a frequency of the high-frequency voltage exceeds an amplitude or a frequency during stable working, so that sufficient voltage is generated on the resistor R2A and the capacitor C2A, so as to turn on the NPN-type triode switch K2; while voltages on the resistor R2 and the capacitor C2 are divided by the third resistor R3 and the fourth resistor R4, the emitter of the PNP-type triode switch K1 generates sufficient forward voltage drop to the base, the switch K1 is saturated, turned on, and controlled to output a high level, meanwhile, the high level is fed back to the base of the switch K2 through the feedback resistor Rfb to ensure that the switch K2 may maintain in a normal turning-on state. When the electronic ballast 310 begins stably working, because an amplitude or a frequency of an alternating-current voltage output by the electronic ballast 310 is greatly reduced, the alternating-current voltage passing through the second capacitor C1A also has voltages on the resistor R2A and the capacitor C2A reduced correspondingly; however, because condensance of the first capacitor C1 is relatively small, the voltage on the resistor R2 and the capacitor C2 is still high enough, which can provide a signal that enables the switching circuit 326 to work stably.

Thus, it may be known that, only when the second frequency detection circuit 324 outputs a voltage signal to cause the switch K2 to be turned on, the output of the switching circuit 326 is at a high level; and after the electronic ballast 310 works stably, continuous high-level output of the first frequency detection circuit 323 and feedback of the feedback resistor Rfb enable the switching circuit 326 to maintain output the high level. When the electronic ballast 310 is turned off, because neither the first frequency detection circuit 323 nor the second frequency detection circuit 324 has a high-level output, and the interface logic circuit 325 is also in an OFF state, at this time, even if the electronic ballast 310 intermittently outputs the high-frequency signal, the resistor R2A and the capacitor C2A, due to relatively large condensance of the second capacitor C1A, cannot have sufficient voltage accumulated thereon to drive the switch K2, the interface logic circuit 325 maintains in the OFF state, and the switching circuit 326 outputs the low level, that is, maintains in an OFF state, which avoids the flashing phenomenon in the lighting lamp having the electronic control circuit 320 when powered off.

Figure 5:
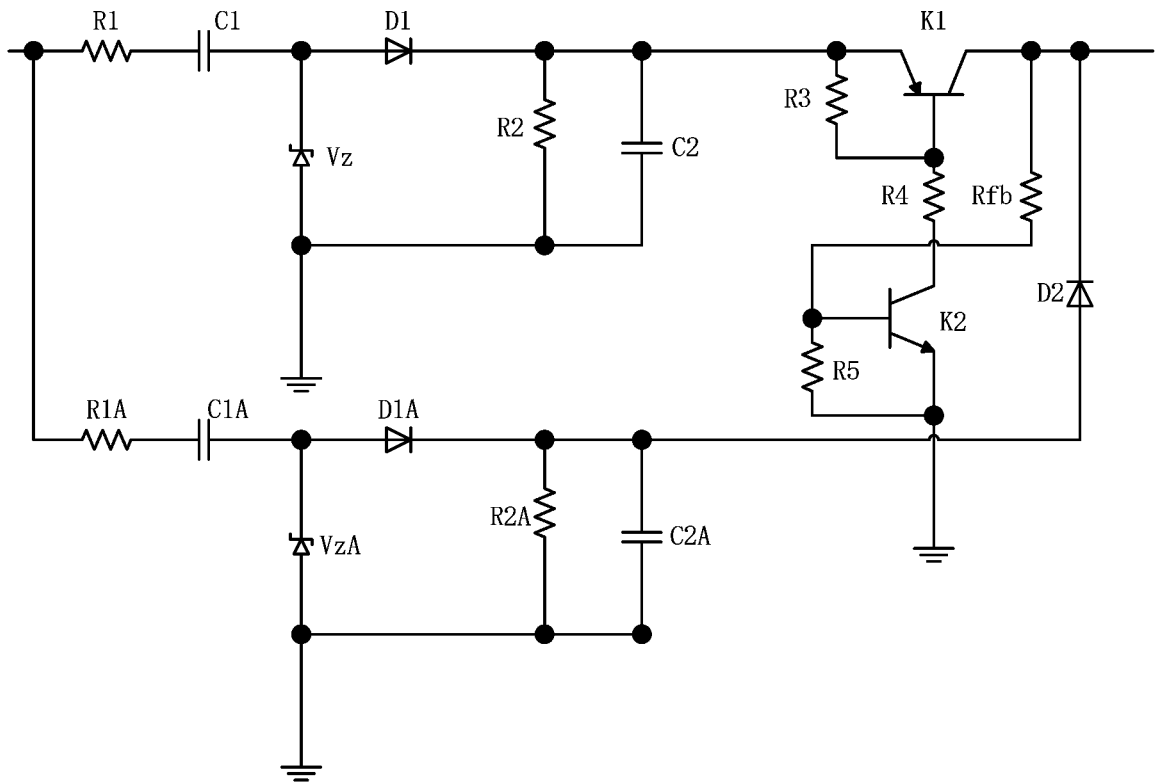
FIG. 5 is a schematic diagram illustrating a circuit structure of an electronic control circuit according to another example of the present disclosure.

FIG. 5 is a partial circuit schematic diagram of an electronic control circuit 320 (with reference to FIG. 3a and FIG. 3b) according to another example. As illustrated in FIG. 5, a first resistor R1, a first capacitor C1, a first diode D1, a first voltage-regulator component and a first voltage-regulator tube Vz constitute a first frequency detection circuit 323 (with reference to FIG. 3a and FIG. 3b), wherein, the first voltage-regulator component is composed of a resistor R2 and a capacitor C2 connected in parallel, the first resistor R1, the first capacitor C1, the first diode D1 and the first voltage-regulator component are sequentially connected in series with an interface logic circuit 325 (with reference to FIG. 3a and FIG. 3b), a negative electrode of the first voltage-regulator tube Vz is connected between the first capacitor C1 and the first diode D1, and a positive electrode of the first voltage-regulator tube Vz is connected with the first voltage-regulator component and grounded; a second resistor R1A, a second capacitor C1A, a second diode D1A, a second voltage-regulator component and a second voltage-regulator tube VzA constitute a second frequency detection circuit 324 (with reference to FIG. 3a and FIG. 3b), wherein, the second voltage-regulator component is composed of a resistor R2A and a capacitor C2A connected in parallel, the second resistor R1A, the second capacitor C1A, the second diode D1A and the second voltage-regulator component are sequentially connected in series with the interface logic circuit 325, a negative electrode of the second voltage-regulator tube VzA is connected between the second capacitor C1A and the second diode D1A, and a positive electrode of the second voltage-regulator tube VzA is connected with the second voltage-regulator component and grounded; wherein, a capacitance value of the first capacitor C1 is greater than a capacitance value of the second capacitor C1A. A PNP-type triode switch K1, an NPN-type triode switch K2, a third resistor R3, a fourth resistor R4, a feedback resistor Rbf, a third diode D2 and a fifth resistor R5 constitute the interface logic circuit 325, wherein, an emitter of the switch K1 is connected with the first frequency detection circuit 323, a collector of the switch K1 is connected with the switching circuit 326 (with reference to FIG. 3a and FIG. 3b), a base of the switch K1 is grounded sequentially through the fourth resistor R4 and the switch K2, the third resistor R3 is connected in parallel with two ends of the switch K1, a positive electrode of the third diode D2 is connected with the second voltage-regulator component in the second frequency detection circuit 324, a negative electrode of the third diode D2 is connected between the switch K1 and the switching circuit 326, the feedback resistor Rbf has one end connected between the switch K1 and the switching circuit 326, and the other end connected with an emitter of the switch K2 through the fifth resistor R5, and a base of the switch K2 is connected between the feedback resistor Rbf and the fifth resistor R5.

In the circuit illustrated in FIG. 5, an output from the second frequency detection circuit 324 is directly connected with the switching circuit 326 through the third diode D2, so that the switching circuit 326 may be directly driven, and a driving signal of the switch K2 may only be fed back from the switching circuit 326 through the feedback resistor Rbf. When the electronic ballast 310 works normally, a high-frequency voltage output by the electronic ballast 310 outputs a high level in the second frequency detection circuit 324, which is directly output to the switching circuit 326 through the third diode D2, to enable the switching circuit 326 to be activated and work; under the high level of the switching circuit 326 and an action of the feedback resistor Rfb, the switch K2 is turned on, so that the emitter of the switch K1 is positively biased toward the base, and the switch K1 is saturated and turned on, to further maintain outputting a high level. When the electronic ballast 310 enters stable working, the second frequency detection circuit 324 outputs a low level, the first frequency detection circuit 323 maintains a high level output, and under reverse cut-off protection of the third diode D2, the switching circuit 326 maintains a high level output and thus maintains an ON state.

Thus, it may be known that, activation of the switching circuit 326 requires the second frequency detection circuit 324 to output a high-level signal; and after the electronic ballast 310 works stably, due to continued high-level output of the first frequency detection circuit 323 and feedback of the feedback resistor Rfb, the switching circuit 326 maintains outputting the high level. When the electronic ballast 310 is turned off, because neither the first frequency detection circuit 323 nor the second frequency detection circuit 324 has a high-level output, and the interface logic circuit 325 is also in an OFF state, at this time, even if the electronic ballast 310 intermittently outputs a high-frequency signal, the resistor R2A and the capacitor C2A, due to relatively large condensance of the second capacitor C1A, cannot have sufficient voltage accumulated thereon to drive the switching circuit 326, so that the interface logic circuit 325 maintains turned off, and the switching circuit 326 outputs a low level, that is, maintains an OFF state, which avoids a flashing phenomenon of the lighting lamp having the electronic control circuit 320 when powered off.

Figure 6:
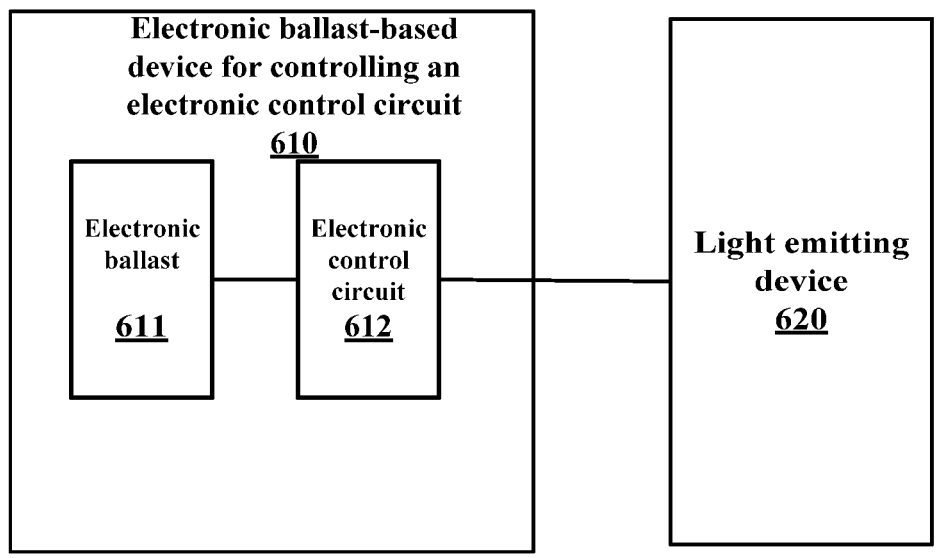
FIG. 6 is a schematic block diagram of a lighting lamp according to an example of the present disclosure.

FIG. 6 is a schematic block diagram of a lighting lamp according to an example of the present disclosure. As illustrated in FIG. 6, the lighting lamp comprises the electronic ballast-based device 610 for controlling an electronic control circuit according to any one of the above-described examples, and a light emitting device 620; wherein, the device 610 comprises an electronic ballast 611 and an electronic control circuit 612, and the light emitting device 620 is connected with the electronic control circuit 612, and configured to be turned on or off under control of the electronic control circuit 612.

In the lighting lamp illustrated in FIG. 6, the electronic control circuit 610 includes a filament analog circuit, a rectifier bridge circuit, at least two frequency detection circuits connected in parallel, an interface logic circuit and a switching circuit. Moreover, one of the frequency detection circuits is configured to be activated when a low-frequency signal is input, the other frequency detection circuit is configured to be activated when a high-frequency signal is input, the interface logic circuit is configured to control working logic of the at least two frequency detection circuits connected in parallel, so that the frequency detection circuit that is activated when the low-frequency signal is input can provide a stable working signal for the switching circuit in the electronic control circuit, and meanwhile, the frequency detection circuit that is activated when the high-frequency signal is input can provide an activating signal for the switching circuit, so that the lighting lamp can maintain stable working after powered on, and can effectively avoid a flashing phenomenon of the light emitting device 620 connected with the electronic control circuit 612 after powered off, so as to reduce a risk of failure of the light emitting device 620, and improve user experience with the lighting lamp.

It may be known from the above-described examples that, the device provided by any one of the examples of the present disclosure can at least achieve advantageous effects below:

In the above-described device, at least two frequency detection circuits connected in parallel are connected in the electronic control circuit, and one end of the at least two frequency detection circuits connected in parallel is connected with the interface logic circuit, to enable the interface logic circuit to control working logic of the at least two frequency detection circuits connected in parallel, so that at least one frequency detection circuit of the device provides an activating signal for the switching circuit in the electronic control circuit, and meanwhile, at least one frequency detection circuit provides a stable working signal for the switching circuit. Therefore, with respect to the lighting lamp having the device, the lighting lamp can maintain stable working after powered on, and effectively avoid the flashing phenomenon of the light emitting device connected with the electronic control circuit in the lighting lamp after powered off, so as to reduce a risk of failure of the light emitting device, and improve user experience with the lighting lamp.

The present disclosure is proposed in order to provide an electronic ballast-based device for controlling an electronic control circuit and a lighting lamp that overcome the problems or at least partially resolve the problems described herein.

According to one aspect of the present disclosure, there is provided an electronic ballast-based device for controlling an electronic control circuit, comprising: an electronic ballast and an electronic control circuit which are connected with each other, the electronic control circuit comprising a filament analog circuit, a rectifier bridge circuit, at least two frequency detection circuits connected in parallel, an interface logic circuit and a switching circuit; wherein:

the electronic ballast is connected with the switching circuit sequentially through the filament analog circuit and the rectifier bridge circuit; the at least two frequency detection circuits connected in parallel have one end connected between the filament analog circuit and the rectifier bridge circuit, or connected between the electronic ballast and the filament analog circuit, and the other end connected with the interface logic circuit; the interface logic circuit is connected with the switching circuit, and the interface logic circuit is configured to control working logic between the at least two frequency detection circuits connected in parallel.

Optionally, the electronic control circuit comprises a first frequency detection circuit and a second frequency detection circuit connected in parallel.

Optionally, the first frequency detection circuit is configured to be activated when a low-frequency signal is input, the second frequency detection circuit is configured to be activated when a high-frequency signal is input, and high-frequency impedance of the first frequency detection circuit is less than high-frequency impedance of the second frequency detection circuit.

Optionally, the first frequency detection circuit comprises a first capacitor, and the first capacitor has one end connected with an input end of the first frequency detection circuit, and the other end connected with the interface logic circuit;

the second frequency detection circuit comprises a second capacitor, and the second capacitor has one end connected with an input end of the second frequency detection circuit, and the other end connected with the interface logic circuit;

wherein a capacitance value of the first capacitor is greater than a capacitance value of the second capacitor.

Optionally, the first frequency detection circuit further comprises a first diode and a first voltage-regulator component, the first diode is connected between the first capacitor and the interface logic circuit, and the first voltage-regulator component is connected in parallel with both ends of the first diode;

the second frequency detection circuit further comprises a second diode and a second voltage-regulator component, the second diode is connected between the second capacitor and the interface logic circuit, and the second voltage-regulator component is connected in parallel with both ends of the second diode.

Optionally, the first voltage-regulator component and the second voltage-regulator component are respectively composed of a resistor and a capacitor connected in parallel.

Optionally, the first frequency detection circuit further comprises a first voltage-regulator tube, the first voltage-regulator tube is connected with the first voltage-regulator component, or, the first voltage-regulator tube has a negative electrode connected between the first capacitor and the first diode, and a positive electrode connected with one end of the first voltage-regulator component and grounded;

the second frequency detection circuit further comprises a second voltage-regulator tube, the second voltage-regulator tube is connected with the second voltage-regulator component, or, the second voltage-regulator tube has a negative electrode connected between the second capacitor and the second diode, and a positive electrode connected with one end of the second voltage-regulator component and grounded.

Optionally, the first frequency detection circuit further comprises a first resistor for current limiting, and the first resistor is connected between the input end of the first frequency detection circuit and the first capacitor;

the second frequency detection circuit further comprises a second resistor for current limiting, and the second resistor is connected between the input end of the second frequency detection circuit and the second capacitor.

Optionally, the interface logic circuit comprises a first controllable switch, the first controllable switch is connected between the first frequency detection circuit and the switching circuit, and the first controllable switch controls working logic between the first frequency detection circuit and the second frequency detection circuit through its own ON-OFF state.

Optionally, the first controllable switch is a triode switch or a field-effect transistor switch.

Optionally, when the first controllable switch is a first triode switch, the interface logic circuit further comprises a second triode switch and a feedback resistor, wherein, an emitter of the first triode switch is connected with the first frequency detection circuit, a collector of the first triode switch is connected with the switching circuit, and a base of the first triode switch is grounded through the second triode switch; the feedback resistor has one end connected between the first triode switch and the switching circuit, and the other end connected with the second triode switch; and an emitter of the second triode switch is grounded.

Optionally, the interface logic circuit further comprises a third resistor for reducing input impedance and a fourth resistor for current limiting, the third resistor is connected in parallel with the emitter and the base of the first triode switch, and the fourth resistor is connected between the base of the first triode switch and a collector of the second triode switch.

Optionally, the other end of the feedback resistor is connected with a base of the second triode switch, the base and the emitter of the second triode switch are respectively connected with two ends of the second voltage-regulator component in the second frequency detection circuit, and the emitter of the second triode switch is grounded through the second voltage-regulator component.

Optionally, the interface logic circuit further comprises a third diode and a fifth resistor, a positive electrode of the third diode is connected with the second voltage-regulator component in the second frequency detection circuit, a negative electrode of the third diode is connected between the first triode switch and the switching circuit, the feedback resistor is connected with the emitter of the second triode switch through the fifth resistor, and the base of the second triode switch is connected between the feedback resistor and the fifth resistor.

Optionally, the first triode switch is a PNP-type triode switch, and the second triode switch is an NPN-type triode switch.

According to another aspect of the present disclosure, there is provided a lighting lamp, comprising:

the electronic ballast-based device for controlling an electronic control circuit according to any one of the above; and a light emitting device, connected with the electronic control circuit in the electronic ballast-based device for controlling an electronic control circuit, and configured to be turned on or off under control of the electronic control circuit.

In the device provided by the example of the present disclosure, at least two frequency detection circuits connected in parallel are connected in the electronic control circuit, and one end of the at least two frequency detection circuits connected in parallel is connected with the interface logic circuit, to enable the interface logic circuit to control working logic of the at least two frequency detection circuits connected in parallel, so that at least one frequency detection circuit of the device provides an activating signal for the switching circuit in the electronic control circuit, and meanwhile, at least one frequency detection circuit provides a stable working signal for the switching circuit. Therefore, the lighting lamp having the device can maintain stable working of the lighting lamp after powered on, and effectively avoid a flashing phenomenon of the light emitting device connected with the electronic control circuit in the lighting lamp after powered off, so as to reduce a risk of failure of the light emitting device, and improve user experience with the lighting lamp.

The above description is only an overview of the technical solutions of the present disclosure, and in order that the technical solutions of the present disclosure are understood more clearly, so as to be implemented according to the contents of the specification, and the above-described and other purposes, features and advantages of the present disclosure are more obvious and understandable, specific implementation modes of the present disclosure are specifically illustrated hereinafter.

The respective examples in the specification are all described in a progressive manner, the same or similar parts between the respective examples may be referred to one another, and each example focuses on differences from the other examples. Particularly, with respect to the system example, since it is basically similar to the method example, the description thereof is relatively simple, and for the relevant parts, the description of the method example may be referred to.

For example, the present disclosure provides a method of manufacturing an electronic ballast-based device for controlling an electronic control circuit.

The method may include providing an electronic ballast and an electronic control circuit which are connected with each other, where the electronic control circuit may include a filament analog circuit, a rectifier bridge circuit, at least two frequency detection circuits connected in parallel, an interface logic circuit, and a switching circuit.

The method may also include connecting the electronic ballast with the switching circuit sequentially through the filament analog circuit and the rectifier bridge circuit; connecting the at least two frequency detection circuits in parallel, where the at least two frequency detection circuits have one end connected between the filament analog circuit and the rectifier bridge circuit, or connected between the electronic ballast and the filament analog circuit, and another end connected with the interface logic circuit; and connecting the interface logic circuit with the switching circuit, and connecting the interface logic circuit to control working logic between the at least two frequency detection circuits connected in parallel.

The purpose, technical solutions and beneficial effects of the present disclosure are further explained in detail in the specific examples as described above. It should be understood that the foregoing examples merely are specific examples of the present disclosure, and not intended to limit the present disclosure. Any modification, equivalent substitution, improvement, and the like, made within the spirit and principles of the present disclosure should be covered within the protection scope of the present disclosure.

In addition, it should be noted that, the language used in this specification is selected primarily for purpose of readability and teaching, rather than for purpose of explaining or defining the subject matter of the present disclosure. Therefore, many modifications and changes will be apparent to those ordinarily skilled in the art without departing from the scope and spirit of the appended claims. With respect to the scope of the present disclosure, the disclosure is illustrative rather than limitative.

The invention claimed is:

1. An electronic ballast-based device for controlling an electronic control circuit, comprising:
 an electronic ballast and an electronic control circuit which are connected with each other, wherein the electronic control circuit comprises a filament analog circuit, a rectifier bridge circuit, at least two frequency detection circuits connected in parallel, an interface logic circuit, and a switching circuit, and wherein:
 the electronic ballast is connected with the switching circuit sequentially through the filament analog circuit and the rectifier bridge circuit; the at least two frequency detection circuits connected in parallel have one end connected between the filament analog circuit and the rectifier bridge circuit, or connected between the electronic ballast and the filament analog circuit, and another end connected with the interface logic circuit; the interface logic circuit is connected with the switching circuit, and the interface logic circuit is configured to control working logic between the at least two frequency detection circuits connected in parallel.

2. The device according to claim 1, wherein the electronic control circuit comprises a first frequency detection circuit and a second frequency detection circuit, wherein the first frequency detection circuit and the second frequency detection circuit are connected in parallel.

3. The device according to claim 2, wherein the first frequency detection circuit is configured to be activated when a low-frequency signal is input, the second frequency detection circuit is configured to be activated when a high-frequency signal is input, and high-frequency impedance of the first frequency detection circuit is less than high-frequency impedance of the second frequency detection circuit.

4. The device according to claim 2, wherein:
the first frequency detection circuit comprises a first capacitor, wherein the first capacitor has one end connected with an input end of the first frequency detection circuit, and another end connected with the interface logic circuit;
the second frequency detection circuit comprises a second capacitor, wherein the second capacitor has one end connected with an input end of the second frequency detection circuit, and another end connected with the interface logic circuit;
wherein a capacitance value of the first capacitor is greater than a capacitance value of the second capacitor.

5. The device according to claim 4, wherein:
the first frequency detection circuit further comprises a first diode and a first voltage-regulator component, wherein the first diode is connected between the first capacitor and the interface logic circuit, and the first voltage-regulator component is connected in parallel with both ends of the first diode;
the second frequency detection circuit further comprises a second diode and a second voltage-regulator component, wherein the second diode is connected between the second capacitor and the interface logic circuit, and the second voltage-regulator component is connected in parallel with both ends of the second diode.

6. The device according to claim 5, wherein the first voltage-regulator component and the second voltage-regulator component comprise a resistor and a capacitor connected with each other in parallel.

7. The device according to claim 5, wherein:
the first frequency detection circuit further comprises a first voltage-regulator tube, wherein the first voltage-regulator tube is connected with the first voltage-regulator component, or, the first voltage-regulator tube has a negative electrode connected between the first capacitor and the first diode, and a positive electrode is connected with one end of the first voltage-regulator component and is grounded;
the second frequency detection circuit further comprises a second voltage-regulator tube; wherein the second voltage-regulator tube is connected with the second voltage-regulator component, or, the second voltage-regulator tube has a negative electrode connected between the second capacitor and the second diode, and a positive electrode is connected with one end of the second voltage-regulator component and is grounded.

8. The device according to claim 7, wherein:
the first frequency detection circuit further comprises a first resistor for current limiting, wherein the first resistor is connected between the input end of the first frequency detection circuit and the first capacitor; and
the second frequency detection circuit further comprises a second resistor for current limiting, wherein the second resistor is connected between the input end of the second frequency detection circuit and the second capacitor.

9. The device according to claim 5, wherein the interface logic circuit comprises a first controllable switch wherein the first controllable switch is connected between the first frequency detection circuit and the switching circuit, and the first controllable switch controls working logic between the first frequency detection circuit and the second frequency detection circuit through its own ON-OFF state.

10. The device according to claim 9, wherein the first controllable switch is a triode switch or a field-effect transistor switch.

11. The device according to claim 10, wherein,
when the first controllable switch is a first triode switch, the interface logic circuit further comprises a second triode switch and a feedback resistor, and wherein:
an emitter of the first triode switch is connected with the first frequency detection circuit, a collector of the first triode switch is connected with the switching circuit, and a base of the first triode switch is grounded through the second triode switch;
the feedback resistor has one end connected between the first triode switch and the switching circuit, and another end connected with the second triode switch; and
an emitter of the second triode switch is grounded.

12. The device according to claim 11, wherein the interface logic circuit further comprises a third resistor for reducing input impedance and a fourth resistor for current limiting, wherein the third resistor is connected in parallel with the emitter and the base of the first triode switch, and the fourth resistor is connected between the base of the first triode switch and a collector of the second triode switch.

13. The device according to claim 12, wherein the other end of the feedback resistor is connected with a base of the second triode switch, wherein the base and the emitter of the second triode switch are respectively connected with two ends of the second voltage-regulator component in the second frequency detection circuit, and the emitter of the second triode switch is grounded through the second voltage-regulator component.

14. The device according to claim 12, wherein the interface logic circuit further comprises a third diode and a fifth resistor, wherein a positive electrode of the third diode is connected with the second voltage-regulator component in the second frequency detection circuit, a negative electrode of the third diode is connected between the first triode switch and the switching circuit, the feedback resistor is connected with the emitter of the second triode switch through the fifth resistor, and the base of the second triode switch is connected between the feedback resistor and the fifth resistor.

15. The device according to claim 11, wherein the first triode switch is a PNP-type triode switch, and the second triode switch is an NPN-type triode switch.

16. A lighting lamp, comprising:
the electronic ballast-based device for controlling an electronic control circuit, wherein the electronic ballast-based device comprises:
an electronic ballast and an electronic control circuit which are connected with each other, wherein the electronic control circuit comprises a filament analog circuit, a rectifier bridge circuit, at least two frequency detection circuits connected in parallel, an interface logic circuit, and a switching circuit, and wherein:
the electronic ballast is connected with the switching circuit sequentially through the filament analog circuit and the rectifier bridge circuit; the at least two frequency detection circuits connected in parallel have one end connected between the filament analog circuit and the rectifier bridge circuit, or connected between the electronic ballast and the filament analog circuit, and another end connected with the interface logic circuit; the interface logic circuit is connected with the switching circuit, and the interface logic circuit is configured to control working logic between the at least two frequency detection circuits connected in parallel; and a light emitting device that is connected with the electronic control circuit in the electronic ballast-based device for controlling the electronic control circuit, and is configured to be turned on or off under control of the electronic control circuit.

17. A method of manufacturing an electronic ballast-based device for controlling an electronic control circuit, comprising:

providing an electronic ballast and an electronic control circuit which are connected with each other, wherein the electronic control circuit comprises a filament analog circuit, a rectifier bridge circuit, at least two frequency detection circuits connected in parallel, an interface logic circuit, and a switching circuit;

connecting the electronic ballast with the switching circuit sequentially through the filament analog circuit and the rectifier bridge circuit;

connecting the at least two frequency detection circuits in parallel, wherein the at least two frequency detection circuits have one end connected between the filament analog circuit and the rectifier bridge circuit, or connected between the electronic ballast and the filament analog circuit, and another end connected with the interface logic circuit; and connecting the interface logic circuit with the switching circuit, and connecting the interface logic circuit to control working logic between the at least two frequency detection circuits connected in parallel.

* * * * *